United States Patent [19]

Rhodes

[11] 4,321,536

[45] Mar. 23, 1982

[54] MAGNETIC FIELD DETECTION BY DIFFERENTIAL PHASE LAG

[75] Inventor: Melvin H. Rhodes, Cedar Rapids, Iowa

[73] Assignee: Rockwell International Corporation, El Segundo, Calif.

[21] Appl. No.: 68,840

[22] Filed: Aug. 22, 1979

[51] Int. Cl.³ .............................................. G01R 33/04
[52] U.S. Cl. .................................................... 324/253
[58] Field of Search ............................... 324/253–255, 324/225

[56] References Cited

U.S. PATENT DOCUMENTS 3,461,382 8/1969 Anderson ............................ 324/253
3,568,052 6/1969 Anderson ............................ 324/253

OTHER PUBLICATIONS

R. Staffin, "6 Ways to Measure Phase Angle", Oct. 1965, Control Engineering, pp. 78–83.

Primary Examiner—Gerard R. Strecker
Assistant Examiner—Walter E. Snow
Attorney, Agent, or Firm—Bruce C. Lutz; Howard R. Greenberg; H. Fredrick Hamann

[57] ABSTRACT

Magnetic field detection apparatus including means for supplying a periodic excitation signal to a rod of magnetic material having high permeability (whether or not it has hysteresis due to retentivity of the core or eddy currents) and means for sensing the external field wherein the material is situated. When the material has retentive properties and there is an external field being detected the flux lag (or lead) relative to the periodic excitation is longer for one flux direction that the other. The difference in these lags provides an indication of the field to be detected. When the material does not have retentive properties, an external field can still be detected by logic circuitry in an embodiment similar to the last mentioned embodiment.

17 Claims, 4 Drawing Figures

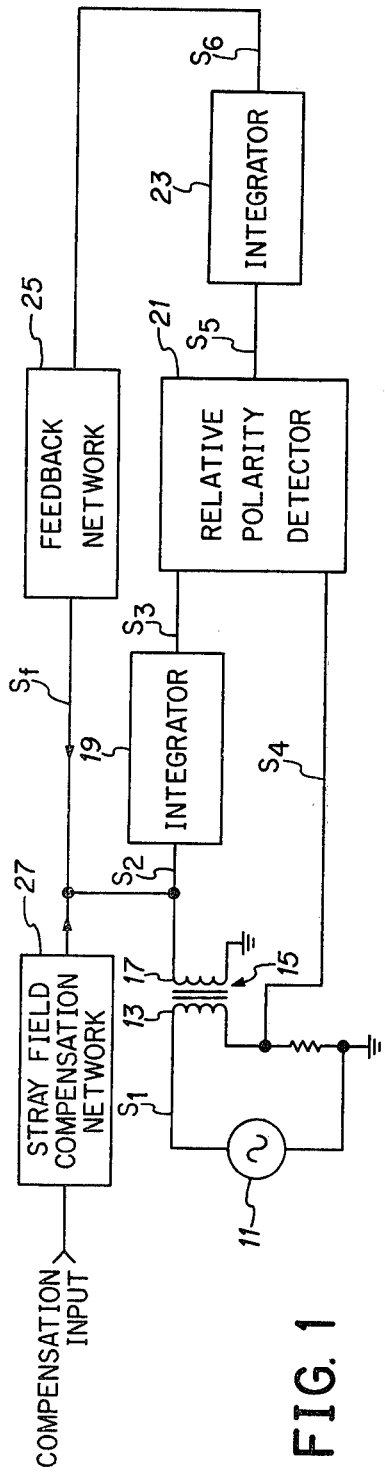
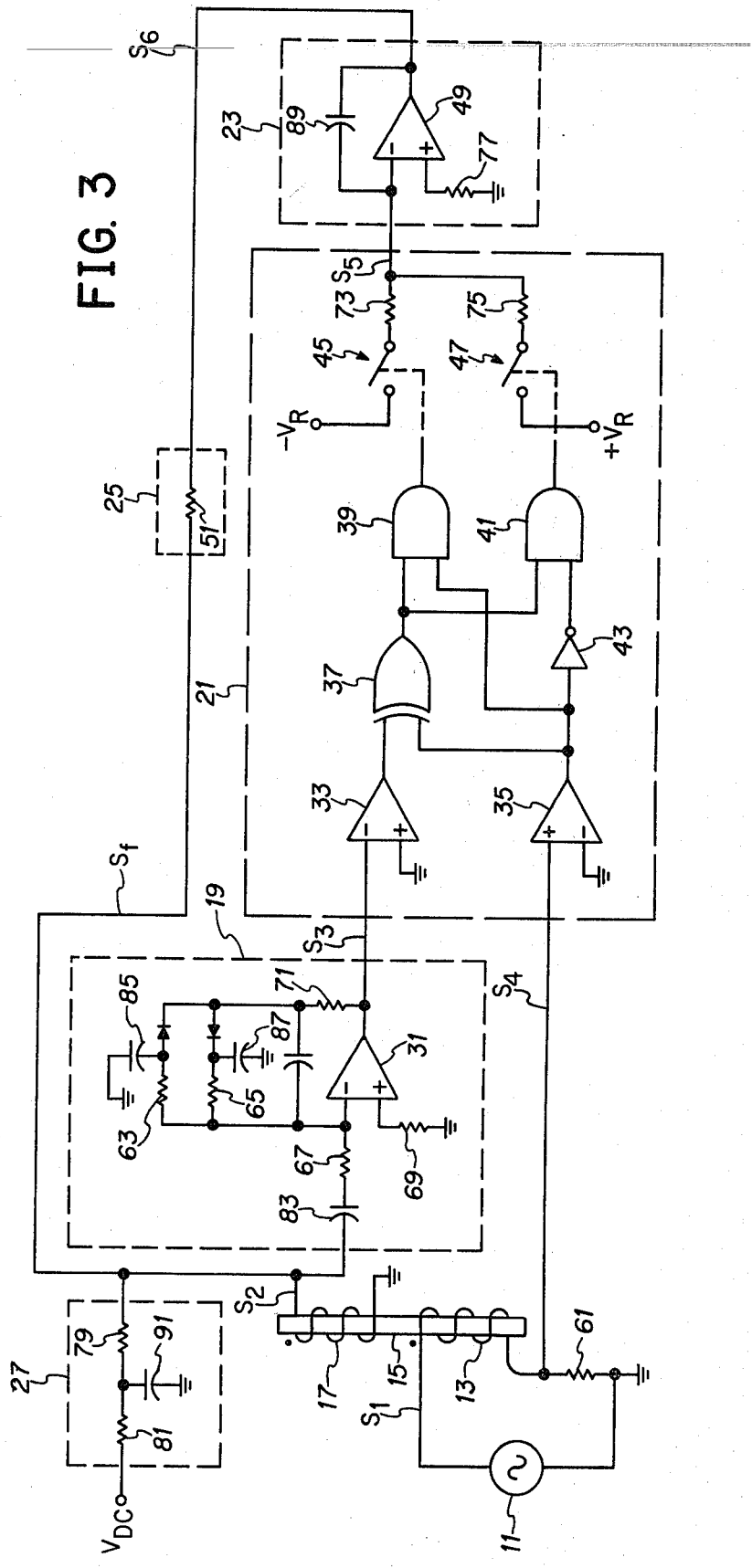
FIG. 1
FIG. 3

MAGNETIC FIELD DETECTION BY DIFFERENTIAL PHASE LAG

BACKGROUND

This invention relates to the detection of magnetic fields.

There are several commonly known techniques for sensing or detecting magnetic fields. Perhaps the oldest known technique is the one employing a permanent magnet. Other exemplary approaches involve second harmonic detection or the flux reset type detection. The principle of a majority, if not all, second harmonic detectors is to provide a magnetic path to the external flux to be detected and to vary the reluctance of this path to change the amount of external flux flowing through the magnetic circuit. See for example U.S. Pat. No. 2,786,179 and my U.S. Pat. No. 4,059,796, both assigned to the assignee hereof. For an example of flux reset detection see U.S. Pat. No. 2,390,051.

Nevertheless, herein is disclosed an approach to magnetic field detection which, it is believed, has heretofore gone unrecognized. More particularly, in accordance with the present invention, the differential phase lag of induced flux, relative to the magnetization field, caused by the steady state field component to be detected, provides an indication of said field to be detected.

These and other objects, features, and advantages of the invention will become more apparent upon reference to the following specification, claims, and appended drawings in which:

FIG. 1 is a block diagram schematic of the presently preferred embodiment;

FIG. 3 is a circuit schematic showing the presently preferred implementation of the FIG. 1 apparatus.

DETAILED DESCRIPTION

Figure 2:
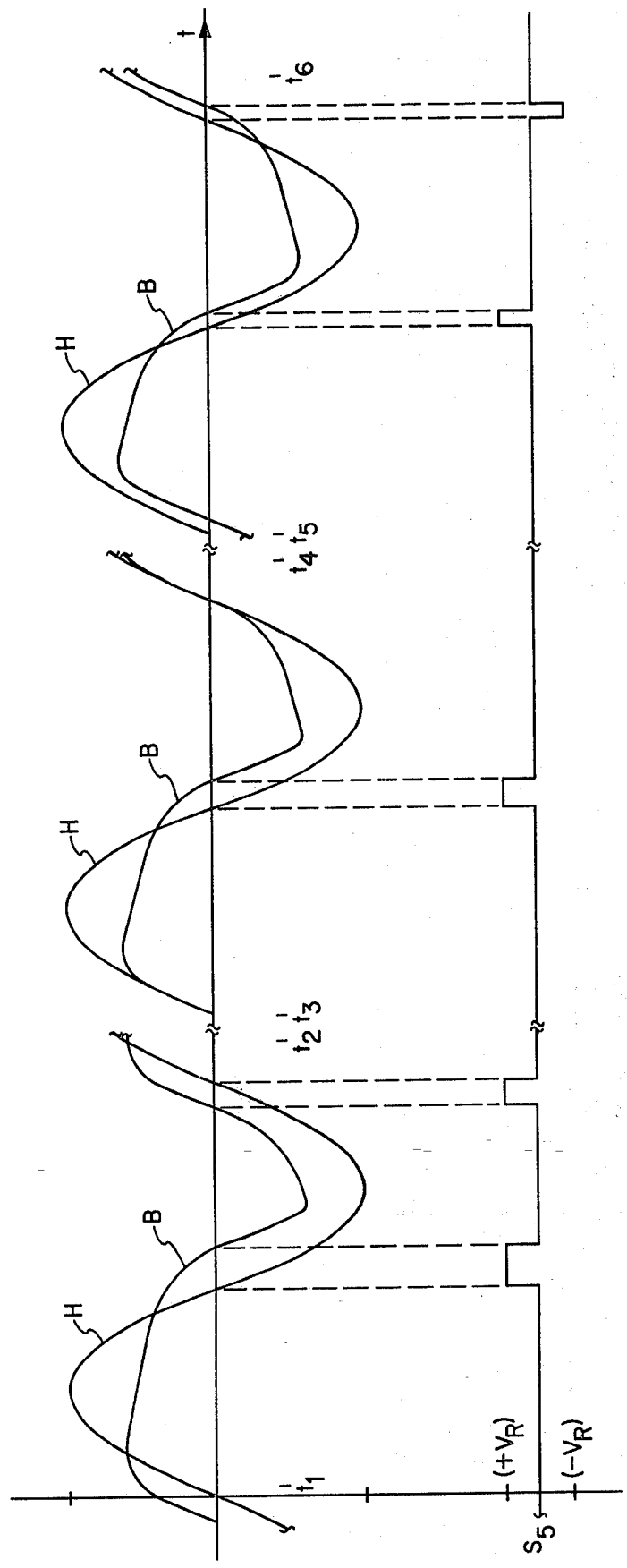
FIG. 2 shows waveforms useful in explaining the principles and operation of the FIG. 1 apparatus.

To briefly preface a more detailed description hereinbelow, it will be recalled that the property of retentivity of a magnetically hysteretic material causes the magnetic flux in said material to lag the magnetization field. Such lag is generally not considered a time lag but may be so considered in relation to the magnetization field that is changing with time. In the absence of influence by an external field (such as the earth's field) the positive going zero crossing of the flux lags the magnetizing field by the same amount as the negative going zero crossing of the flux lags the magnetizing field assuming that saturation occurs in each direction between zero crossings. However, if the magnetizing field contains a steady state or DC component and an alternating component, the lag for both directions will be the same for the total field but with respect to the applied alternating field one lag will be longer than the other one. Moreover, depending on the various factors involved, one lag can even be considered negative, i.e., can be a phase lead. This difference in phase lag, or differential phase lag as it is herein referred to, makes it possible to detect a steady state field and the direction of that field.

Part of the concept of the present invention is the use of a rod of magnetic material of such a design that the magnitude or strength of the field being sensed significantly affects the magnitude of the excitation field required to produce a saturation of the magnetic core. An external field in the longitudinal direction of the core will require that the excitation field magnitude, required to produce a given level of saturation, will be different in one direction than in the other by a magnitude equal to twice the component of the external field affecting or acting upon the core. By definition in this application, saturation is when the incremental permeability of the core drops below a given value. The excitation field is produced by current in a winding on the rod or core with the current changing at a given and constant rate so that the induced voltage is greater than a specified value as long as the core incremental permeability is greater than a given specified value. The excitation field is reversed on a periodic basis with the excitation being such that saturation always occurs in one direction of excitation and normally occurs in both directions of excitation. On a slightly different aspect of the present invention, it has been determined that if a magnetic rod is used with a very large length to diameter ratio, or in other words, very long compared to its diameter, its permeability at the center of the core will be very nearly equal to the permeability of the core material. The field acting on the center of the core is given by the equation $$H = H_O - \frac{N(B - H)}{4\pi}$$

where H is the field acting at the center of the rod, $H_O$ is the field in the sensing apparatus, $N/4\pi$ is the demagnetizing factor as determined from a set of data which may be found on page 846 of the book, "Ferromagnetism" by Bozorth published in 1951 by D. Van Nostrand Company, Inc., where $\mu$ is much larger than 150, and m is the length-to-diameter ratio of the magnetic rod. For an m ratio of 200 to 1, the value of $N/4\pi$ is 0.0001.

For the present invention, the interest is focused on the change of incremental permeability as the core goes into saturation. The permeability of the core material when using a high-mu 80 material will change from 100,000 to 1,000 as the field across the material is increased. As set forth in the referenced book by Bozorth, $$1/\mu' = 1/\mu + N/4\pi$$

where ($\mu'$) is the apparent permeability, ($\mu$) is the permeability of the material, and $N/4\pi$ is the demagnetizing factor provided in the material of FIG. 19-4b on page 847 of the referenced book.

It has been found by calculations, that for m=200 and $N/4\pi=0.0001$, that where $\mu$ equals 100,000, $\mu'$ equals 9090, where $\mu$ equals 10,000, $\mu'$ equals 5,000 and where $\mu$ equals 1,000, $\mu'$ equals 909.

In practicing the invention, it has been found that the field required to decrease the permeability of the core material to 5,000 requires about 0.1 oersted and the earth's field maximum value is approximately 0.6 oersteds. Since the two fields can sum, the drive capabilities for the core will be 0.7 oersteds maximum plus the demagnetizing factor $N/4\pi$ as determined by the above reference. Although it is not believed necessary to provide the calculations, it has been found that the field at the center of a coil, with a long length-to-diameter ratio is:

$$H_0 = 1.26NI$$

where N is the turns per centimeter for the coil, $H_0$ is the field in the sensing apparatus as previously indicated and I is the current in the coil. If number 40 wire is used and the turns per centimeter is about 100, the resultant peak current required is approximately 0.0246 amperes. The peak-to-peak current requirement will be in the range of 0.049 amps. If it is desired that the frequency be approximately 400 hertz for excitation as in the preferred embodiment, then the rate of change for the current should be 0.049÷by 0.00125 or approximately 39.2 amperes per second rate of change.

The preferred embodiment of the present invention uses a sinusoidal excitation current signal to provide the excitation field. This produces a sinusoidal rate of change of current through a coil that has a small diameter-to-length ratio for the magnetic material enclosed therein. Due to characteristics of the magnetic material coacting with the coil, the output signal will be delayed by a given amount relative to the exciting or excitation signal when there is no external magnetic field. The presence of an external magnetic field will alter the delay. This alteration will reduce or increase the delay depending upon the direction of the external magnetic field relative to the direction of the field as generated or induced by the excitation coil. The magnitude of the alteration is dependent upon the magnitude of the external magnetic field.

In view of the above, the present invention uses logic circuitry to measure the delay for a determination of the magnetic field. The preferred embodiment measures the zero crossing of the excitation field and the output signal from the coil. However, it will be apparent that other reference points may be utilized.

Since very small magnetic fields must be measured, it is desirable to have the measuring apparatus be as sensitive as possible. Thus, the unit is made very sensitive and the detected delay alteration is supplied to an integrator which retains a total history of the sensing unit. The output of the integrator is then used as a feedback signal to substantially exactly counteract the effects of the external magnetic field whereby the delay being detected by the circuitry at any given moment in time is normally very minimal. On the other hand, the integrator output, since it represents the total history of the sensing unit, provides an indication of the total magnetic field in the area of the sensing device.

As will be observed from a reading of the specification, the integrating device may be either analog or digital in the practice of the invention. As used in this specification, saturation is defined as a condition of the magnetic core wherein a given change in the field H produces a very small change in magnetic flux B as compared to the change in magnetic flux B for the same change in magnetic field H when there are comparatively few lines of flux in the core. It is to be realized, therefore, that while many definitions of saturation use this meaning, true saturation could also be defined as the point at which there is no further change in permeability with large changes in field intensity. The change in flux density per unit change in field as used herein will be defined as incremental permeability.

Turning now to FIG. 1, a current source 11 supplies an alternating drive signal $S_1$ which drives winding 13 to effect a time varying magnetizing field H(t) which induces time varying flux B(t) in magnetic core 15. Winding 17 couples with said flux and supplies a time varying signal $S_2$ which is proportional to dB(t)/dt. Integrator 19 receives $S_2$ and supplies a signal $S_3$ which is approximately proportional to B(t). $S_3$ and $S_4$, the latter a signal proportional to $S_1$, are fed to relative polarity detector 21 which provides an output signal $S_5$ according to the following Table I.

TABLE I

| $S_3$ (polarity) | $S_4$ (polarity) | $S_5$ |
|---|---|---|
| + | + | O |
| + | − | $+V_R$ |
| − | + | $-V_R$ |
| − | − | O |

$S_5$, which comprises a train of pulse-width modulated pulses each having a magnitude of plus or minus $|V_R|$, is integrated in 23 which in turn supplies signal $S_6$ to feedback network 25 whose output $S_f$ is connected to winding 17. $S_f$ produces a magnetic field which opposes, offsets or cancels the effects of any substantially nonvarying external magnetic field sensed by core 15. When the $S_f$ generated field opposingly equals, or effectively cancels, the external field with respect to core 15, the differential phase lag becomes zero, the $S_5$ pulse train pulses each become the same width and alternate in polarity, and $S_6$ becomes proportional to the external magnetic field. It may be noted that as the magnetic retentivity of the core becomes less, the width of the pulses $S_5$ becomes less at balanced conditions until, with no retentivity, the pulses become infinitesimally narrow.

Network 27, when employed, delivers a predetermined DC bias to winding 17 and permits the effects of stray external fields affecting core 15 to be canceled.

The waveforms of FIG. 2 further aid in describing the inventive concepts herein. Therein, H and B represent respectively the aforementioned source induced magnetic field and flux as effected when $S_1$ is sinusoidal. Signals $S_4$ and $S_3$ vary with time as, and bear proportional relationships to, waveforms H and B respectively. Waveform $S_5$ is the output of the FIG. 1 detector 21. In FIG. 2, time increases from left to right, such that the $t_1$ to $t_2$ time interval precedes $t_3$ to $t_4$ interval which in turn precedes the $t_5$ to $t_6$ interval. The $t_1$ to $t_2$ interval shows the initial influence of the external field before $S_f$ has had an opportunity to build up and cancel much or any of the external field effects. That is, at the negative going zero crossing of H, the flux B lags H by several degrees. At the positive going zero crossing of H, B leads H by several degrees. Consequently, $S_5$ for the interval $t_1$ to $t_2$ comprises a pair of pulse-width modulated pulses each being of amplitude $+V_R$. The widths of said pulses correspond to the lag or lead of B relative to H at the zero crossings of H. Since the integral of $S_5$ is positive during the $t_1$ to $t_2$ interval, a partially canceling field is developed through winding 17 and the phase of B appears to shift relative to H as the core 15 proceeds to a condition of being saturated equally on positive and negative half cycles of the drive signal $S_1$.

The $t_3$ to $t_4$ time interval represents an intermediate time interval wherein such a partially canceling field has been developed within winding 17. During this intermediate interval it is seen that at the negative going zero crossing of B, B still lags H but by a lesser amount than in the first illustrated interval. At the positive going zero crossing of H, B neither lags nor leads H. The resulting $S_5$ waveform for this interval comprises one pulse whose width corresponds to the lag of B at the negative going zero crossing of H. No pulse (or a pulse of zero width) appears at the positive going zero crossing of H since this crossing coincides with the zero crossing of B. Although the integral of $S_5$ for the $t_3$ to $t_4$ interval is less than the integral for the $t_1$ to $t_2$ interval, it is nevertheless still positive and thus the integrator 23 output $S_6$ and the canceling field both continue to increase and cause further apparent shift of the phase of B relative to H.

At some later time such as the $t_5$ to $t_6$ interval, the phase of B relative to H becomes such that B lags H by the same number of degrees at both the negative going and positive going zero crossings of H. When this occurs $S_5$ becomes as illustrated, each pulse being of the same width and alternating pulses being of opposite polarity. Over the $t_5$ to $t_6$ time interval, the average value of $S_5$ is zero and $S_6$ and $S_f$ no longer continue to increase. Thus, for the $t_5$ to $t_6$ interval, the feedback generated compensating field opposingly equals the sensed external field with respect to the core 15, the differential phase lag is zero, and the integrator output $S_6$ is proportional to the external magnetic field.

As previously indicated, the width of the positive and negative pulses in the condition illustrated during times $t_5$ to $t_6$ are dependent upon the retentivity of the magnetic core. If the retentivity is zero, the pulse width of these two pulses will also be zero and thus there will be effectively no $S_5$ signals generated in the balanced or stable condition. On the other hand, if the magnetic core has a great deal of retentivity, the width of the pulses in the $t_5$ to $t_6$ time frame will be much wider than illustrated.

The presently preferred implementation is shown in additional detail in FIG. 3. Core 15 comprises a single permalloy rod 0.010 inches in diameter and 2.0 inches in length. As will be noted, this set of dimensions gives a cross section-to-length ratio of 200. The larger this ratio becomes, the more direction sensitive the sensor becomes. The minimum ratio that can be used depends upon the permeability of the core. When using high-mu 80 material as used in the preferred embodiment of the invention, a ratio of 100 would perform satisfactorily under most conditions. However, a greater alteration in output signal as a function of drive signal is obtained with the higher ratios. More information on this factor may be ascertained from a book on "Ferromagnetism", authored by Bozorth, published in 1951 by the D. Van Nostrand Company, Inc., on pages 845 and 846. The primary problem with having two large a ratio is the space required for the sensor if the diameter of the core is significant and on the other hand, the problems of keeping the core in a condition of alignment if the diameter is reduced to provide the appropriate ratio.

In the preferred embodiment, each of the windings 13 and 17 comprise 1,000 turns. Integrator 19 comprises an op amp 31 whose inverting input is fed through a high-pass series RC filter and whose feedback path includes rectification and filtering to provide an AC integration function such as shown in my application Ser. No. 740,914, filed Mar. 11, 1976 and now abandoned. This form of integrator is preferred because it reduces the DC offset at the output of the integration. Although such an integrator may add some phase shift, the added phase shift is the same for both directions of travel along the hysteresis curve, and therefore such phase addition does not affect the final results since the information is contained in the difference between succeeding pulse widths.

Relative polarity detector 21 comprises two op amps 33 and 35 which receive $S_3$ and $S_4$ respectively and operate as comparators, and which output to EXCLUSIVE OR gate 37. AND gates 39 and 41 receive the output of EXCLUSIVE OR gate 37 and the output of op amp 35, the output of 35 to the input of 41 being first inverted by inverter 43. Gates 39 and 41 drive switches 45 and 47 respectively, said switches being opened and closed by low and high inputs respectively. Integrator 23 comprises an op amp 49 rising capacitive feedback. Feedback network 25 comprises a resistor 51. Compensation network 27 comprises a low-pass "T" filter.

Also, in the preferred embodiment, source 11 provides a drive signal of sufficient peak amplitude to assure, for the condition where the differential phase lag is zero, that the magnetic field H is strong enough to cause the core to saturate at both extremes. It appears that satisfactory operation may be obtained when the frequency of $S_1$ is anywhere within the range of about 20 Hz to more than 100 kHz. The frequency presently employed is about 400 Hz. Table II, on the following page, gives the presently preferred values of the resistors and capacitors in FIG. 3.

TABLE II

| ITEM | VALUE |
|------|-------|
| 51 | 2,000 ohms |
| 61 | 33 ohms |
| 63 | 301 Kilohms |
| 65 | 301 kilohms |
| 67 | 10 kilohms |
| 69 | 147 kilohms |
| 71 | 1 kilohm |
| 73 | 100 kilohms |
| 75 | 100 kilohms |
| 77 | 196 kilohms |
| 79 | 5.1 kilohms |
| 81 | 5.1 kilohms |
| 83 | 0.1 microfarads |
| 85 | 1 microfarad |
| 87 | 1 microfarad |
| 89 | 1 microfarad |
| 91 | 0.002 microfarads |

It will be apparent to those skilled in the art that various modifications may be made without departing from the inventive teachings herein. For example, if integrator 23 and feedback network 25 were entirely eliminated such that no compensating or canceling field were effected, and the output of detector 21 were averaged, such as in a low-pass filter, the output of said filter would be representative of the strength and direction of the external magnetic field for very small magnitudes. However, the output of such a circuit would be nonlinear and would be more difficult to calibrate than the FIG. 1 type embodiment.

While not used in the preferred embodiment, the relative polarity detector 21 may also be designed to operate according to the following truth table illustrated as Table III in place of the logic earlier described by Table I.

TABLE III

| $S_3$ (polarity) | $S_4$ (polarity) | $S_5$ |
|---|---|---|
| + | + | $+V_R$ |
| + | − | 0 |
| − | + | 0 |
| − | − | $-V_R$ |

Figure 4:
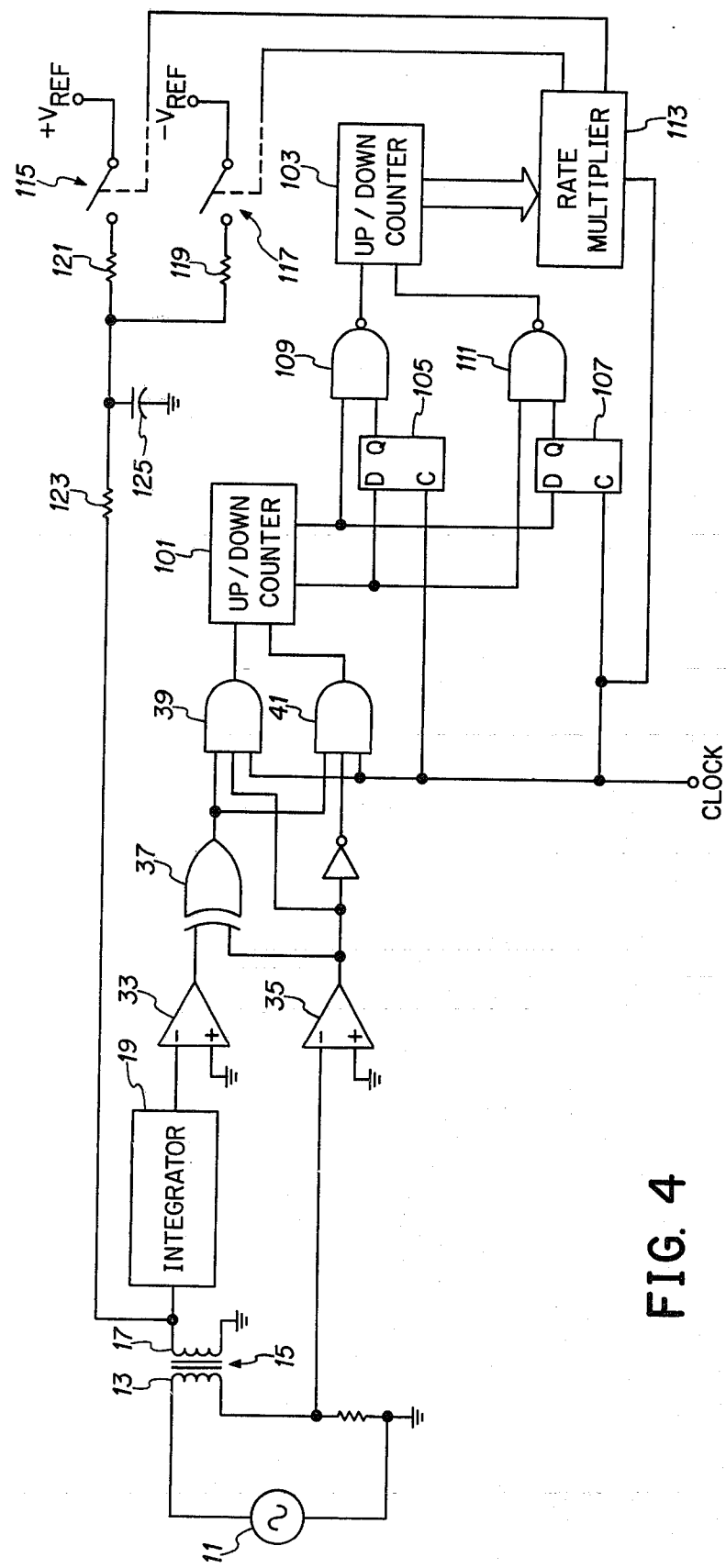
FIG. 4 is a circuit schematic showing an alternative digital implementation.

Digital implementations of the inventive concept are, of course, possible and practical. One such implementation is shown in FIG. 4. From source 11 through AND gates 39 and 41, the FIG. 4 circuit is the same as that of FIG. 3. For the FIG. 4 circuit, however, a clock signal is also input to each of AND gates 39 and 41, and the output of said gates controls an up-down counter 101. The underflow and overflow pulses from up-down counter 101 drive a second up-down counter 103 via D flip-flops 105 and 107 and NAND gates 109 and 111. The output of up-down counter 103 is fed to a rate multiplier 113 which has a pulse rate output on one of two output means. The value of the count in counter 103 determines the rate of this output and the sign of the count from counter 103 determines on which of the two rate multiplier output means the rate output appears. Each of the rate multiplier outputs controls one of switches 115 or 117 which switch positive or negative DC reference voltages to a low-pass feedback filter network comprising items 119, 121, 123, and 125.

The operation of FIG. 4 is relatively straightforward and quite similar to that of FIG. 1. The output of integrator 19 is passed through logic circuitry which operates counter 101. Counter 101 operates somewhat in the manner of a filter so as to prevent minute or transient changes in the field being measured from affecting the feedback signal. The clock signal being applied to the various components in FIG. 4 is typically 50 to 100 times the frequency of the excitation signal supplied by source 11. If the magnetic field being measured changes and remains changed, the counter 101 in a short period of time provides sufficient additional counts so that it will overflow or underflow and thus provide an up or down count respectively to up-down counter 103. The rate multiplier 113 provides a digital number to duty cycle analog output conversion and thus operates one of the switches 115 or 117 to provide a duty cycle return signal through resistor 123 to be applied to winding 17 for counteracting the induced flux in core 15 as generated by the field being sensed. The count in counter 103 is indicative of the direction and magnitude of the field being sensed by core 15 when the feedback signal exactly balances the flux generated by the field being sensed.

While the up-down counters have been shown divided into two portions for purposes of illustration, it will be readily observed by one skilled in the art that the same end results can be obtained by using a single counter with substantially the same total number of bit capacity as the two counters 101 and 103 and merely using a number of the most significant bits of the counter to drive rate multiplier 113. The number of most significant bits used would be substantially the same as the number of bits in up-down counter 103.

While block 19 is illustrated as an integrator, it should be obvious to one skilled in the art that this block can be replaced with a multivibrator whose frequency ranges up or down from a median value as the magnetic field being sensed changes direction and magnitude. In such a situation, the counter 103 uses a median value count as being indicative of the flux rather than having different digital signs for different directions of the magnetic flux being sensed. However, the magnetic field indicative output can also be taken from the feedback signal rather than from the counter to obtain a direct analog indication of the strength and direction of the magnetic field being sensed. Although the preferred embodiment of FIG. 1 utilizes two integrators in the detection process, it should be realized that a single integrator may be used to detect the DC component of the signal output by winding 17. However, the integrator must be relatively slow as compared to the preferred embodiment and the feedback loop operation of such a system will occasionally cause errors due to non-linearities generated when the magnetic field being sensed is not immediately canceled. In view of the above considerations, the double integrator concept has been determined to be more desirable for a given application of the invention. However, the concept does include the single integrator version.

It should also be realized that although FIG. 2, for illustrative purposes shows that the core, as typified by waveform B, may occasionally create a condition where saturation does not occur on ½ of the excitation signal. However, most designs of this invention would be constructed and connected such that saturation would occur in both directions of excitation for all normally sensed magnetic field conditions.

While the preferred embodiment illustrates the detection of zero crossing time differential for both positive and negative excitation half cycles, the invention will work equally well using a single time differential as long as the magnetic field is known to be in generally the same direction as the sensor being used and will not reverse 180 degrees with respect thereto.

Thus, while various embodiments of the present invention have been shown and described, it is apparent that changes and modifications may be made therein without departing from the invention in its broader aspects. The aim of the appended claims, therefore, is to cover all such changes and modifications as fall within the true spirit and scope of the invention.

What is claimed is:

1. Magnetic field detection means comprising:
   magnetic material first means;
   excitation second means for supplying a periodic excitation signal $S_1$ to said first means so as to induce therein flux which varies with time according to $\psi(t)$;
   sensing third means for generating, in response to said time varying flux, a time varying signal $S_3$ from which the phase of $\psi(t)$ relative to $S_1$ may be determined; and
   fourth means for receiving $S_3$ and $S_1$ indicative signals and outputting a signal $S_\Delta$ indicative of the differential $\Delta = (PD_\alpha - PD_\beta)$, where $PD_\alpha$ is the phase difference between $S_1$ and $\psi(t)$ when the phase of $S_1$ is substantially an angle $\alpha$, and where $PD_\beta$ is the phase difference between $S_1$ and $\psi(t)$ when the phase of $S_1$ is substantially an angle $\beta$ where $\beta \neq \alpha$.

2. Magnetic field detection means as defined in claim 1 and further comprising fifth means for receiving and integrating $S_\Delta$, and feedback sixth means receiving the fifth means output for canceling the effect of flux induced in said first means by the magnetic field to be detected.

3. Magnetic field detection means as defined in claim 1 wherein said fourth means includes integrating means for providing a signal approximately proportional to $\psi(t)$.

4. Magnetic field detection means as defined in claim 1 wherein the difference between $\alpha$ and $\beta$ is substantially 180°.

5. Magnetic field detection means as defined in claim 4 wherein $\alpha$ corresponds to a zero crossing of $S_1$.

6. Magnetic field detection means as defined in claim 1 wherein the peak magnitude of $S_1$ is sufficient, when $\Delta$ is approximately zero, to drive magnetic material first means into saturation for each direction of said time varying flux.

7. Magnetic field detection means comprising:
first magnetic material means;
excitation second means for supplying a periodic excitation signal f(t) to said first means so as to induce therein flux which varies with time according to $\phi(t)$;
winding third means for coupling with said time varying flux and outputting a signal g(t) substantially proportional to $d\phi(t)/dt$;
integrator fourth means for receiving g(t) and outputting a signal substantially proportional to $\phi(t)$; and
fifth means, having two input means $t_1$ and $t_2$ and output means $t_3$ for receiving f(t) and $\phi(t)$ indicative signals each at a different one of $t_1$ and $t_2$ and for outputting a signal $S_o$ at $t_3$ according to a predetermined one of columns X and Y of the following table:

| $t_1$ (polarity) | $t_2$ (polarity) | Column X $t_3$ | Column Y $t_3$ |
|---|---|---|---|
| + | + | A | E |
| + | − | B | F |
| − | + | C | G |
| − | − | D | H | where A, B, C, D, E, F, G, and H are predetermined DC levels, where A and D are both intermediate to B and C, and where F and G are both intermediate to E and H.

8. Magnetic field detection means as defined in claim 7 wherein C is substantially equal to −B, H is substantially equal to −E, and A, D, F and G are all substantially equal to zero.

9. Magnetic field detection means as defined in claim 7 and further comprising integrator sixth means for producing a signal $S_{int}$ representative of the integration of $S_o$; and
feedback seventh means receiving $S_{int}$ for canceling the effect of flux induced in said first magnetic material means by the magnetic field being detected.

10. The method of detecting magnetic fields comprising, the steps of:
periodically and bidirectionally exciting a magnetic material such that magnetic flux saturation occurs in both directions of excitation, the time differential between zero crossings of an excitation signal and zero crossings of the induced magnetic flux being equal and constant for both directions of excitation in the absence of a magnetic field to be detected;
detecting the time differential between adjacent zero crossings of the excitation signal and corresponding zero crossings of the induced magnetic flux; and
outputting a signal indicative of the detected time differential as being representative of the magnetic field being detected.

11. Apparatus for detecting magnetic field strength comprising, in combination:
magnetic material means;
source means for applying a bidirectional magnetic flux saturating, alternating excitation signal to said magnetic material means to induce a magnetic flux therein; and
detection means coacting with said magnetic material means and said source means for outputting a magnetic field strength signal as a function of the relative time differential between adjacent zero crossings of the excitation signal and the induced magnetic flux.

12. Apparatus as claimed in claim 11 wherein said detection means includes:
AC integration means, including a winding on said magnetic material means for receiving induced magnetic flux signals therefrom and a feedback signal terminal, for outputting a signal indicative of the integrated value of only alternating components of received signals;
relative polarity detection means, connected to said source means and to said AC integration means, for providing output signals indicative of the relative polarity of received signals from said source means and said AC integration means; and
further integration means, connected to said relative polarity detection means and to said feedback signal terminal, for supplying the magnetic field strength signal as a feedback signal to minimize magnetic flux in said magnetic material means when the signal from said source means passes through a predetermined value.

13. The method of detecting magnetic fields comprising, the steps of:
periodically and bidirectionally exciting a magnetic material such that magnetic flux saturation occurs in both directions of excitation, the time differential between adjacent zero crossings of an excitation signal and zero crossings of the induced magnetic flux being equal and constant for both directions of excitation in the absence of a magnetic field to be detected;
detecting said time differential; and
outputting a signal indicative of the detected time differential and representative of the magnetic field being detected.

14. Apparatus for detecting magnetic field strength comprising, in combination:
magnetic material means;
source means for applying a bidirectional magnetic flux saturating, alternating excitation signal to said magnetic material means; and
detection means coacting with said magnetic material means and said source means for outputting a magnetic field strength signal as a function of the relative time differential between opposing identical hysteresis loop values.

15. Sensor apparatus for detecting magnetic field strength comprising, in combination:
magnetic material means;
source means for applying a bidirectional magnetic flux saturating, alternating excitation signal to said magnetic material means;
integration means coacting with said magnetic material means and said source means for outputting a magnetic field strength signal as a function of the relative saturation times induced by alternate half cycles of the excitation signal; and
feedback means connected to said integration means and said magnetic material means for counteracting the effects of a sensed magnetic field by supplying a signal to more nearly equalize saturation times.

16. The method of detecting magnetic fields comprising, the steps of:
periodically and bidirectionally exciting a magnetic material such that magnetic flux saturation occurs in both directions of excitation, the time differential between adjacent zero crossings of an excitation signal and corresponding zero crossings of the induced magnetic flux being equal and constant for both directions of excitation in the absence of a magnetic field to be detected;

detecting the time differential between zero crossings of the excitation signal and the induced magnetic flux for both directions of magnetic flux saturation; and outputting a signal indicative of the detected time differential as being representative of the magnetic field being detected.

17. Sensor apparatus for detecting magnetic field strength comprising, in combination:

magnetic material means including separate excitation signal input winding means and magnetic field strength signal output winding means;

source means for applying a bidirectional magnetic flux saturating, alternating excitation signal to said magnetic material means;

integration means coacting with said output winding means of said magnetic material means and said source means for outputting a magnetic field strength signal as a function of the relative saturation times induced by alternate half cycles of the excitation signal; and feedback means connected to said integration means and one of said winding means of said magnetic material means for counteracting the effects of a sensed magnetic field by supplying a signal to more nearly equalize saturation times.

* * * * *